US012747993B2

(12) United States Patent
Chang et al.

(10) Patent No.: US 12,747,993 B2

(45) Date of Patent: Sep. 29, 2026

(54) LATERAL BIPOLAR JUNCTION TRANSISTOR DEVICE AND METHOD OF FORMING SAME

(71) Applicant: Taiwan Semiconductor Manufacturing Company LTD, Hsinchu (TW)

(72) Inventors: Wei-Jen Chang, Miaoli (TW); Bor-Jou Lin, Hsinchu (TW); Hung-Han Lin, Hsinchu (TW); Chung-Shih Chiang, Zhubei (TW)

(73) Assignee: TAIWAN SEMICONDUCTOR MANUFACTURING COMPANY, LTD., Hisinchu (TW)

( * ) Notice: Subject to any disclaimer, the term of this patent is extended or adjusted under 35 U.S.C. 154(b) by 454 days.

(21) Appl. No.: 18/370,459

(22) Filed: Sep. 20, 2023

(65) Prior Publication Data

US 2025/0093211 A1 Mar. 20, 2025

(51) Int. Cl.

| | |
|---|---|
| ***G01K 7/01*** | (2006.01) |
| ***H10D 10/01*** | (2025.01) |
| ***H10D 10/60*** | (2025.01) |
| ***H10D 62/10*** | (2025.01) |
| ***H10D 86/00*** | (2025.01) |

(52) U.S. Cl.

CPC ........... *G01K 7/015* (2013.01); *H10D 10/061* (2025.01); *H10D 10/60* (2025.01); *H10D 62/126* (2025.01); *H10D 86/201* (2025.01)

(58) Field of Classification Search

CPC ...................................................... H10D 10/60

See application file for complete search history.

(56) References Cited

U.S. PATENT DOCUMENTS

| | | | |
|---|---|---|---|
| 2020/0227523 | A1 | 7/2020 | Leipold et al. |
| 2021/0134987 | A1 | 5/2021 | Yang et al. |
| 2022/0254703 | A1 | 8/2022 | Kahrimanovic et al. |

(Continued)

FOREIGN PATENT DOCUMENTS

| | | | |
|---|---|---|---|
| TW | 201444082 | A | 11/2014 |
| TW | 201916373 | A | 4/2019 |
| TW | 201921629 | A | 6/2019 |

(Continued)

OTHER PUBLICATIONS

Chinese Office Action—Application No. 11320796710 Dated: Aug. 7, 2024.

*Primary Examiner* — Yu-Hsi D Sun

(74) *Attorney, Agent, or Firm* — Lippes Mathias LLP

(57) ABSTRACT

A lateral-bipolar junction transistor (BJT) including a semiconductor substrate, an insulator region disposed on the semiconductor substrate, and a well region comprising a well semiconductor of a first conductivity type disposed over the insulator region. An emitter region of a second conductivity type is disposed in the well region, and at least one collector region of a second conductivity type is disposed in the well region. A T shaped, Pi shaped or H shaped gate and gate oxide layer includes a gate portion extending between the emitter region and one or more collector regions, and a base is disposed underneath the gate portion. In other embodiments, a metal oxide semiconductor (MOS) transistor-based circuit similarly employs a compact Pi or H shaped gate and gate oxide layer.

20 Claims, 7 Drawing Sheets

(56) References Cited

U.S. PATENT DOCUMENTS

2022/0270954 A1* 8/2022 Yanagisawa ........ H01L 23/4824
2023/0088282 A1 3/2023 Chen et al.

FOREIGN PATENT DOCUMENTS

TW 202042393 A 11/2020
TW 202228288 A 7/2022
TW 202236433 A 9/2022

* cited by examiner

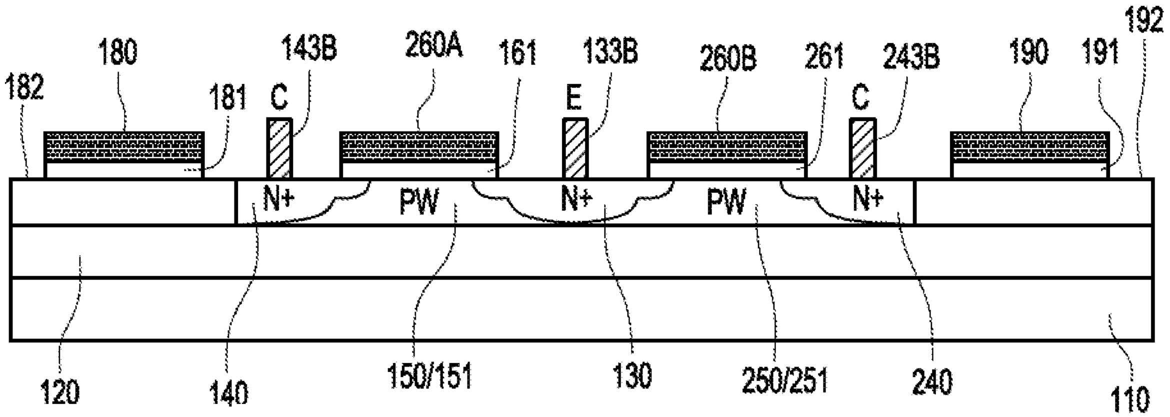
FIG. 2B(AA)
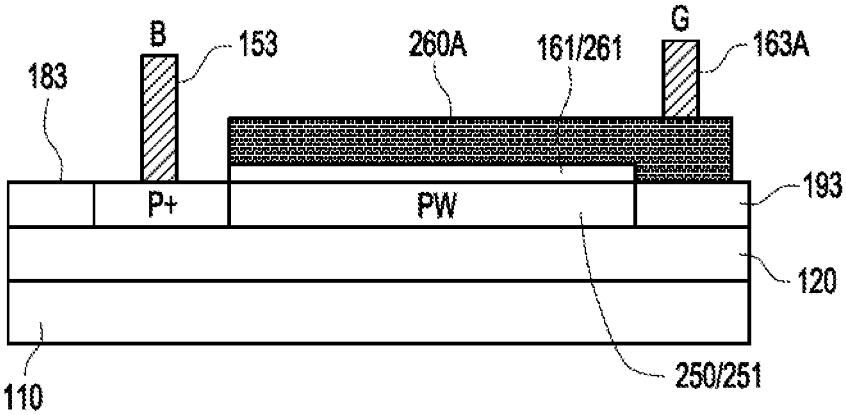
FIG. 2C(BB)
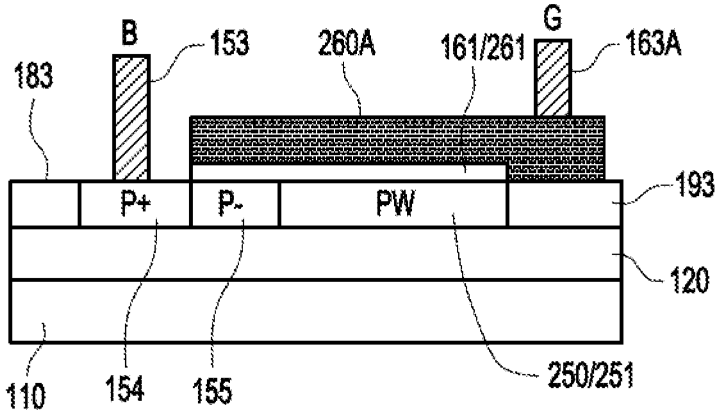
FIG. 2D(BB)

LATERAL BIPOLAR JUNCTION TRANSISTOR DEVICE AND METHOD OF FORMING SAME

BACKGROUND

The following relates to the semiconductor, devices, Lateral-Bipolar Junction Transistor (BJT) devices, metal oxide semiconductor (MOS) devices, methods of forming the foregoing, and to circuits such as thermal sensors and bandgap reference circuits employing same.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2D diagrammatically illustrates aspects of a Lateral-Bipolar Junction Transistor Device including a Pi shaped gate. FIG. 2A illustrates a top view, FIG. 2B illustrates cross-sectional view AA of FIG. 2A, FIG. 2C illustrates a cross-sectional view BB of FIG. 2A, and FIG. 2D illustrates another cross-sectional view BB according to another aspect of a Lateral-Bipolar Junction Transistor Devices as illustrated in FIG. 2A.

FIG. 3A illustrates a Lateral-Bipolar Junction Transistor Device including a T shaped gate and gate oxide layer; FIG. 3B illustrates a Lateral-Bipolar Junction Transistor Devices including a Pi shaped gate; and FIG. 3C illustrates a Lateral-Bipolar Junction Transistor Devices including a H shaped gate.

DETAILED DESCRIPTION

Figure 1:
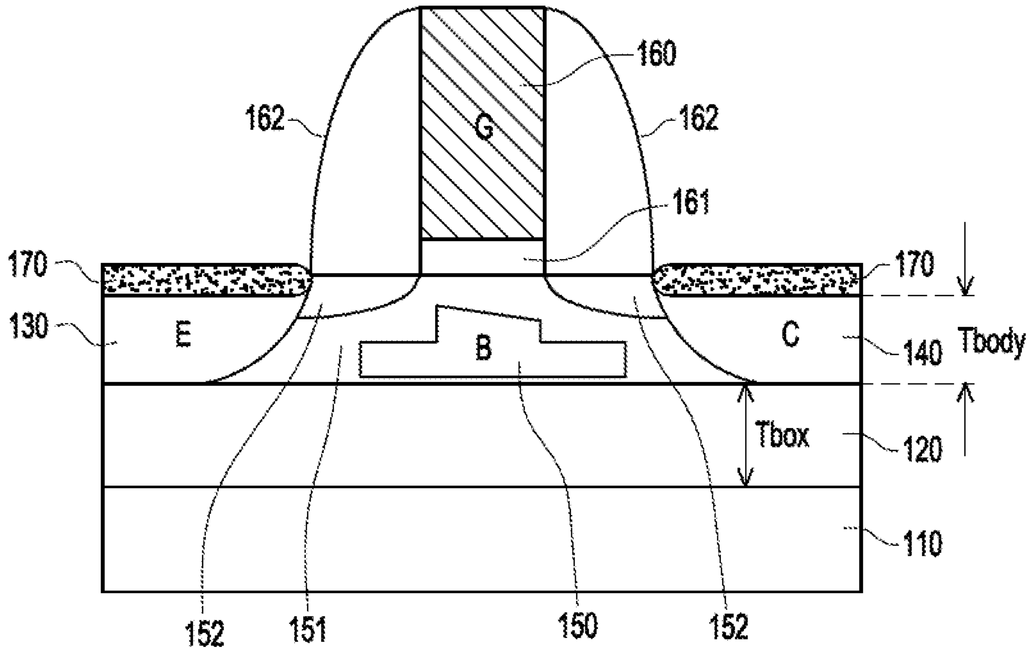
FIG. 1 diagrammatically illustrates a side sectional view of a Lateral-Bipolar Junction Transistor Device according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Bipolar junction transistors (BJTs) are used in a wide range of analog, digital, and mixed analog/digital integrated circuits. BJTs can be grouped as NPN BJTs (NBJTs) and PNP BJTs (PBJTs). An NPN BJT is an NPN transistor comprising doped regions, namely an n-type emitter E, a p-type base B, and an n-type collector C. Conversely, a PNP BJT is a PNP transistor with a p-type emitter E, an n-type base B, and a p-type collector. To enhance emitter injection efficiency, in some designs the emitter E is encircled by the base B and collector C.

The traditional BJT layout is a vertical design. Vertical BJTs employ a vertical structure, for example formed by double-diffusion. This type of transistor is sometimes known as substrate transistor.

Thin body silicon on Silicon on Insulator (SOI) wafers are limited by thickness for forming a vertical BJT device according to conventional methods. For example, in some SOI wafers the silicon layer is less than 300 nanometers in thickness, which may make fabrication of a vertical BJT difficult or impossible. For such situations, a lateral BJT design may be employed, in which the base material (e.g., the silicon layer of an SOI wafer for an NPN BJT design) is p-type and the emitter and collector regions are formed by n-type dopant diffusion or implantation into the p-type base layer. In the lateral BJT design, the emitter and collector regions of the BJT are spaced apart laterally. However, fabricating a compact lateral BJT is challenging. The lateral design naturally occupies larger area. Furthermore, N and P implants can have misalignment which result in the variation of defining BJT base size, thus limiting the practically achievable critical dimension for these device features and/or calling for utilization of more complex fabrication processes such as self-alignment techniques. In addition, alignment of the emitter and collector regions with the Shallow Trench Isolation (STI) and Resist Protection Oxide (RPO) processes presents further challenges to miniaturization.

In various embodiments disclosed herein, approaches to lateral BJT fabrication are disclosed which facilitate achieving compact lateral BJT devices and compact arrays of BJTs, and provide reduced gate resistance (Rg) and base resistance (Rb). For example, in one aspect the base of the BJT is located underneath the gate, rather than being laterally offset from the gate. In this approach, a partially depleted region underneath the gate constitutes the base region of the BJT.

In another approach, the layout of the BJT has designed symmetry to reduce Rg and Rb, and to reduce variability between BJT devices. For example, the gate of the BJT may have a T, Pi, or H shape. As an example, the BJT may have collector regions symmetrically arranged on opposite sides of a central emitter region. A Pi shaped gate then has a first gate portion extending between the emitter region and the first collector region, a second gate portion parallel to the first gate portion and extending between the emitter region and the second collector region, and a first connecting gate portion transverse to the first and second gate portions and connecting the first and second gate portions. Connection of the gate by the connecting gate portion provides reduced gate resistance (Rg). Furthermore, where combined with the aspect of the base being located underneath the gate, a base line connecting to the base underlying the first and second gate portions similarly provides reduced base resistance (Rb).

In a variant H shaped gate, the Pi shaped gate is modified to further include a second connecting gate portion arranged parallel with the first connecting gate portion and also connecting the first and second gate portions, and the emitter region and the first and second collector regions are disposed between the first connecting gate portion and the second connecting gate portion. This provides further symmetry and increased contact area for the gate (thus further reducing Rg) and base (thus further reducing Rb).

In BJT based circuits, these compact BTJ layouts can be synergistically combined to reduce the circuit layout area. For example, the connecting gate portion or portions can be leveraged to provide compact BJT-BJT interconnects for common sub-circuit elements such as a BJT with a common base-collector connection or a pair of BJTs with common base. In such cases, the first (and optional second) connecting gate portion and corresponding underlying base region can facilitate compact formation of these interconnections, for example by butting the bases of mirrored BJT devices.

While primarily described with respect to lateral BJT devices, in further embodiments disclosed herein metal oxide semiconductor (MOS) field effect transistor (FET) devices employ similar compact layout designs, e.g., including a T shaped, Pi shaped, or H shaped gate, and such MOSFET layouts can be analogously leveraged to reduce circuit layout area and/or to reduce device resistances.

Other problems associated with conventional BJT circuits, for example, band gap reference circuits and thermal sensor circuits are related to sensitivity to mismatch. According to some aspects of this disclosure, mismatch sensitivity is improved, for example by the symmetric arrangement of the Pi or H shaped gate. Also, reduced device size and increased operational current is achieved using a layout arrangement of multi-cross coupling, thereby averaging the process variation. Furthermore, the butted base of mirror devices can reduce the total layout area.

Disclosed herein are lateral-bipolar junction transistors (BJTs) which include one or more T shaped, Pi shaped and/or H shaped gates, using for example, polysilicon or a high-K metal material such as titanium nitride (TiN) or tantalum nitride (TaN). Furthermore, disclosed herein are circuits including a common base/body and mixed cross-coupled layout placement for a Flipped-gate MOS circuit.

Further advantages/benefits of this disclosure and the embodiments described herein, include, but are not limited to, providing a tunable BJT n-factor (ideality factor) by an additional gate terminal and flipped gate process. A compact layout area reduces the mismatch between paired devices.

With reference to FIG. 1, illustrated are aspects of a Lateral-Bipolar Junction Transistor Devices including a base disposed underneath the gate to provide for a more compact device.

A shown, the Lateral-Bipolar Junction Transistor Device is a gated Lateral-Bipolar Junction Transistor, including a Si substrate 110, a Buried Oxide (i.e., BOX, for example $SiO_2$) 120, an emitter region 130, a collector region 140, and a base region 150. The base region 150 is formed as a non-depleted or partially depleted portion of a body 151 comprising a depleted region. Optionally, also included are drain implants 152. A conductive gate region 160 is made of polysilicon or a high-K metal material such as titanium nitride (TiN) or tantalum nitride (TaN). Optional spacers 162, for example Si, may be employed in forming the gate 160. A gate oxide layer 161 is disposed beneath the gate region 160 and above the base and body 150/151.

In a suitable fabrication process, the BJT of FIG. 1 is an NPN BJT formed on a starting SOI wafer with a p-type silicon layer. The emitter and collector regions 130 and 140 are formed by dopant diffusion or dopant implantation of n-type dopant sufficient to convert the p-type silicon material to n-type in those regions 130 and 140. By suitable design of the doping profile of the device, the p-type material beneath the gate 160 and gate oxide 161 is depleted thus forming the body 151, except for a central region of the p-type material which is non-depleted or partially depleted—this non-depleted or partially depleted central portion forms the p-type base 150 of the NPN BJT located underneath the gate 160 and gate oxide 161. It is noted that the base 150 is non-depleted or partially depleted in the unbiased or quiescent state of the NPN BJT. During operation of the NPN BJT, the base 150 can be more fully depleted or even accumulated in response to appropriate electrical bias on the gate 160. The gate oxide 161 is deposited by a suitable technique, such as chemical vapor deposition (CVD), atomic layer deposition (ALD), or so forth. The gate oxide 161 may, for example, be silicon dioxide ($SiO_2$) or a high-k dielectric material. The gate 160 is formed on the gate oxide 161 by any suitable deposition technique for the polysilicon, TiN, TaN, or other chosen gate material (e.g., CVD, et cetera).

Fabrication of the BJT of FIG. 1 as a PNP BJT is similar, except that the starting SOI wafer suitably has an n-type silicon layer, and the emitter and collector regions 130 and 140 are formed by dopant diffusion or dopant implantation of p-type dopant sufficient to convert the n-type silicon material to p-type in those regions 130 and 140.

Advantageously, this design placing the base 150 underneath the gate 160 and gate oxide 161 provides a more compact BJT, and can also reduce device resistances. This aspect of forming the base 150 underneath the gate 160 can in general be employed in conjunction with any lateral BJT design to achieve such advantages. In some illustrative embodiments, this aspect is combined with compact BJT layouts also disclosed herein to obtain synergistic advantages.

As will be further described below, the lateral-BJT base 150 formed by non-depleted body portion 150 under the polysilicon-gate 160 is employed in conjunction with a T-shape gate, a Pi shaped gate or a H shaped gate.

Applying a negative Vg bias (accumulation in NMOS) to the polysilicon gate can be a knob to tune the n-factor (reality factor) of the device, besides tuning the implant process. Alternatively, a flipped gate process, by swapping N/PMOS polysilicon-gate pre-dopant or metal gate stack, can change the surface potential of the body Si (reference Tbody) and affect the n-factor as applying negative Vg bias. According to one embodiment, Tbody (Si) has a thickness of 50~200 nm; and Tbox has a thickness of 1~3 um.

It is to be understood that the gated lateral-BJT shown and described with reference to FIG. 1 is provided to illustrate a cross-sectional view of a gated BJT according to this disclosure and may in some embodiments be incorporated into a T shaped polysilicon gated BJT, a Pi shaped polysilicon gated BJT and/or a H shaped polysilicon gated BJT as further described below. (FIG. 2 shows a Pi shaped gated BJT, FIGS. 3A-3C further show a T shaped gated BJT, a Pi shaped gated BJT and a H shaped gated BJT).

Figure 2A:
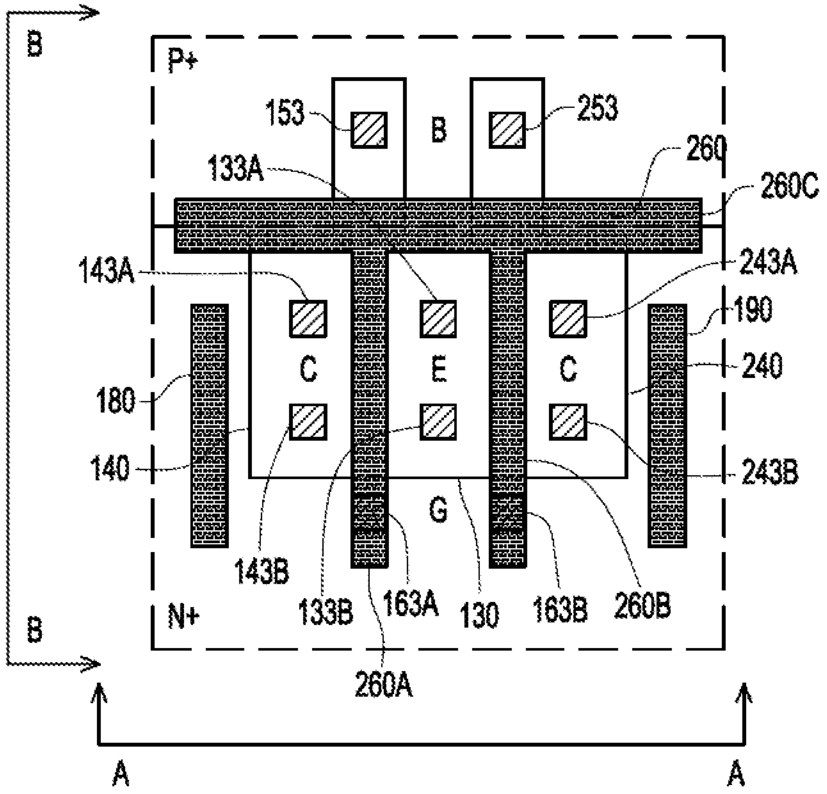

With refence to FIGS. 2A-2D, illustrated are aspects of a Lateral-Bipolar Junction Transistor Devices including a Pi shaped gate and gate oxide layer. FIG. 2A illustrates a top view, and FIG. 2B illustrates cross-sectional view AA of FIG. 2A.

As shown in FIG. 2A, the Lateral-Bipolar Junction Transistor Device includes a Pi shaped gate (and underlying gate oxide layer, not visible in the top view) 260 and includes a double BJT configuration. The Pi shape gate can reduce the Rb (base resistance) and the resistance of emitter and collector pick-up metal routing. It also can mitigate the influence of the process nonuniformity by providing a compact and symmetric layout. The Lateral-Bipolar Junction Transistor includes a single emitter region 130, and first and second collector regions 140 and 240, which during operation are electrically connected using a metallization layer (not shown in FIGS. 2A-2D, suitably formed as part of back end-of-line (BEOL) processing) and including a conductive trace electrically connecting the first and second collector regions 140 and 240 to provide a single collector. Base region 150/151 is disposed between the emitter region 130 and first collector region 140, and base region 250/251 (See FIG. 2B) is disposed between emitter region 130 and second collector region 240. Base region pickups for electrical contacts 153 and 253 are implemented as a p+ doped region 154 (as also seen in FIGS. 2C and 2D). Other electrical contacts include collector contacts 143A, 143B, emitter contacts 133A, 133B, collector contacts 243A, 243B and gate contacts 163A and 163B. Polysilicon or High high-K metal material isolation regions 180 and 190 (formed together with the polysilicon or high-K gate) are also provided.

As shown in FIG. 2B, illustrated is cross-sectional view AA indicated in FIG. 2A, which shows a NPN BJT, where the collector regions 140 and 240 are N+ doped, the emitter region 130 is N+ doped, the well is a P type doped well, and which further includes a P+/PW base region, and the semiconductor substrate 110 in this illustrative example is a bulk P type silicon substrate of the SOI wafer. Alternatively, the disclosed gated lateral BJT device can be configured as a PNP BJT where the collector regions 140 and 240 would be P+ doped, the emitter region 130 would be P+ doped, and the well would be an N type doped well. The Buried Oxide ($SiO_2$) 120 (BOX) layer of the SOI wafer is disposed underneath the P type well layer. Gate oxide layers 161 and 261 are disposed under the Pi shaped gate portions 260/261 between the gate region 260A/260B and the respective base regions 150/151 and 250/251. In some nonlimiting illustrative examples, the gate oxide layers 161 and 261 thickness is in the range of 2 nanometers to 10 nanometers. Gate oxide layers 181 is disposed between polysilicon member 180 and shallow trench isolation region 182 (STI), and gate oxide layers 191 is disposed between polysilicon member 190 and shallow trench isolation region 182 (STI), Regarding the base regions 150/151 and 250/251, base region 150/151 includes a base region 150 which is nondepleted or partially depleted and a body depleted region 151 (see FIG. 1). The base 150 and body 151 include the same material (silicon), however the base 150 is partially depleted. The body region 151 is partially or fully depleted in the unbiased or quiescent state, but can be partially depleted or accumulated by a suitable Vg bias applied on gate G.

According to an embodiment, layer 170 (shown in FIG. 1) is a silicide layer of metal (for example, Co, Ti) and silicon. In some embodiments, the silicide layer 170 is employed in self-aligned formation of contacts to the underlying emitter and collector 130 and 140, e.g., using a self-aligned silicide (salicide) process. Drain implants 152 (shown in FIG. 1) are lightly doped drain (LDD) implants and are not required for an optimized BJT.

With reference to FIG. 2C, illustrated is a cross-sectional view BB of FIG. 2A, and FIG. 2D illustrates another, alternative, cross-sectional view BB according to another aspect of a Lateral-Bipolar Junction Transistor Devices as illustrated in FIG. 2A.

As shown in FIG. 2C, in addition to the regions previously described with reference to FIGS. 2A and 2B, shown is a base extension region for providing connectivity for base contacts 153/253. The base extension regions include a P+ type region 154 within the P type well that connects a base contact 153/253 to the respective base regions 151/251. Alternatively, as shown in FIG. 2D, the base extension regions include a P-type region 155 and a P+ type region within the P type well that serially connect base contact 153/253 to the respective base regions 151/251.

As described above, a gated lateral-bipolar junction transistor (BJT) is provided. The gated lateral BJT includes a semiconductor substrate with an insulator region disposed on the semiconductor substrate and a well region of a first conductivity type disposed over the insulator region. An emitter region of a second conductivity type is further disposed in the well region, and first and second collector regions of a second conductivity type are disposed in the well region.

A Pi shaped (as shown in FIG. 2A) or H shaped (see FIG. 3C) gate includes:

a) a first gate portion 260A extending between the emitter region 130 and the first collector region 140, b) a second gate portion 260B, parallel to the first gate portion, extending between the emitter region 130 and the second collector region 240, and c) a (first) connecting gate portion 260C transverse to the first and second gate portions and connecting the first and second gate portions.

As best seen in FIG. 1, a base region 150 is disposed underneath the first gate portion 260A and underneath the second gate portion 260B, such that the base 150 is located between the emitter 130 and first collector 140 as seen in FIG. 1, and similarly between the emitter 130 and the second collector 240 (due to the second gate portion 260B extending between the emitter region 130 and the second collector region 240).

Regarding the first and second base regions underlying the respective first and second gate portions 260A and 260B, the base region 150 includes an undepleted or partially depleted portion 150 of the well semiconductor material located underneath the gate portion that is surrounded by the depleted portion 151 of the well semiconductor material. A base region extension region laterally extends the first/second base regions to provide first and second base region connections beyond the polysilicon/high-K metal gate covering of the top surface of the first and second base regions.

The Pi shaped gate of FIG. 2A actually includes two BJTs—one formed by the emitter 130 and the first collector 140 with the first gate portion 260A extending between the emitter region 130 and the first collector region 140; and the other formed by the emitter 130 and the second collector 240 with the second gate portion 260B extending between the emitter region 130 and the second collector region 240. However, in some applications, the BEOL processing includes interconnection of the two collectors 140 and 240 and interconnection of the two base portions underlying the respective first and second gate portions so that the BJT of FIG. 2A is electrically connected to form a single BJT at the circuit level. This approach provides a compact and symmetric BJT design with long gate and base lines to reduce Rg and Rb respectively.

Figure 3A:
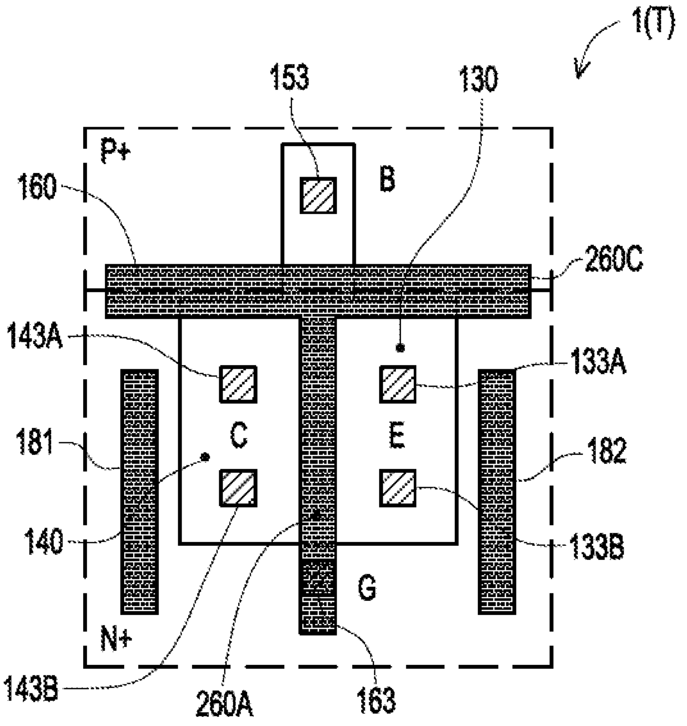
FIGS. 3A-3C diagrammatically illustrate top views of Lateral-Bipolar Junction Transistor Devices according to various embodiments.
Figure 3B:
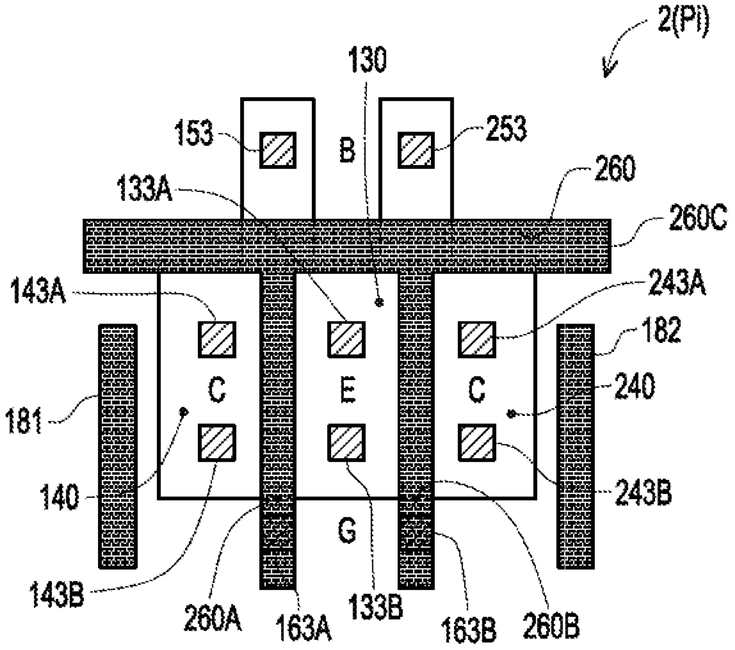
Figure 3C:
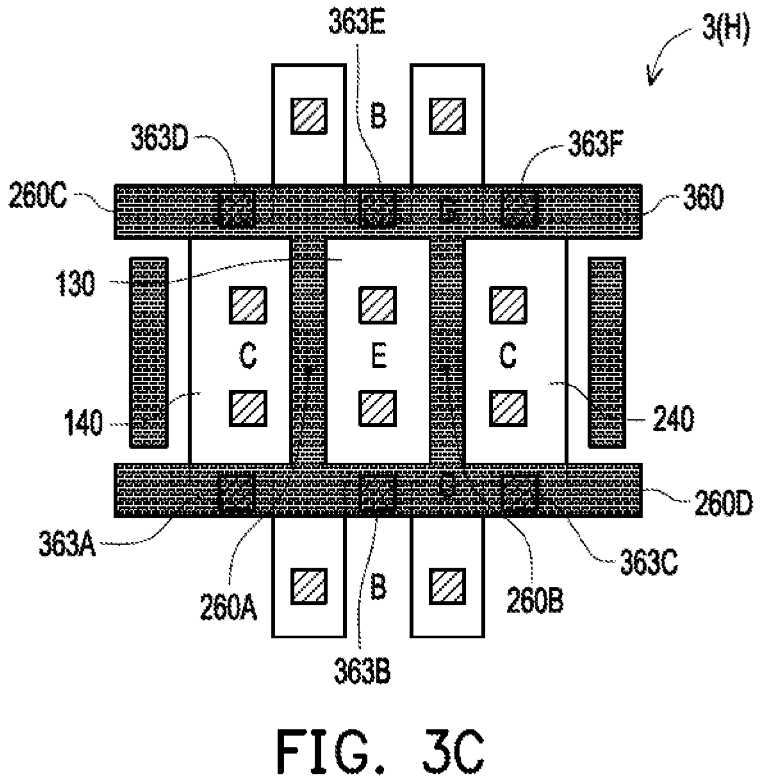

FIGS. 3A, 3B, and 3C illustrate some other compact gate layouts. FIG. 3A illustrates a T shaped gate, with the emitter 130 and only a single collector 140 and a single gate portion 260A extending between the emitter region 130 and the single collector 140. (Effectively, this corresponds to the embodiment of FIG. 2A but without the second collector 240 and second gate portion 260B). FIG. 3B illustrates the same Pi gated BJT of FIG. 2A. To provide an H shaped gate, as shown in FIG. 3C the gate includes the first and second gate portions 260A and 260B and the first connecting gate portion 260C, and further includes a second connecting gate portion 260D that is arranged parallel with the first connecting gate portion 260C and also connects the first and second gate portions 260A and 260B, and the emitter region 130 and the first and second collector regions 140 and 240 are disposed between the first connecting gate portion 260C and the second connecting gate portion 260D. Third and a fourth base region extension regions laterally extending the respective first and second base regions to provide base region connections beyond the H shaped polysilicon/high-K metal gate covering of the top surface of the first and second base regions.

According to one nonlimiting more specific illustrative example of an NPN BJT embodiment, the semiconductor substrate is a silicon (Si) substrate; the insulator region is silicon dioxide; the well region is a P type well; the emitter region is N+ doped; and the first and second collector regions are N+ doped. According to one nonlimiting more specific illustrative example of a PNP BJT embodiment, the semiconductor substrate is a silicon (Si) substrate; the insulator region is silicon dioxide; the well region is a N type well; the emitter region is P+ doped; and the first and second collector regions are P+ doped. It should be noted that while in the illustrative examples the lateral BJTs are formed in the silicon layer of an SOI wafer, it is contemplated to instead form the lateral BJTs on the surface of a bulk silicon wafer, or in an epitaxially deposited silicon layer, or so forth.

While the detailed description thus far and below focuses on a Pi and H shaped gated double BJT, it is to be understood a T shaped gated single BJT of FIG. 3A is also within the scope of this disclosure. Specifically, a gated lateral-bipolar junction transistor including a semiconductor substrate; an insulator region disposed on the semiconductor substrate; and a well region of a first conductivity type disposed over the insulator region. An emitter region of a second conductivity type is disposed in the well region and a single collector region of a second conductivity type is disposed in the well region.

A base region equivalent to that described with reference to a Pi and H shaped gated BJT, is disposed in the well region, the base region located between the emitter region and the collector region, and; a single continuous T shaped polycrystalline silicon gate and gate oxide layer covers a top surface of the base region. A base region extension region laterally extends the base region to provide a base region connection beyond the T shaped polysilicon gate covering of the top surface of the base region.

Additional features of the T shaped gated BJT, include, but are not limited to, a first isolation region laterally adjacent the base region extension region; a second isolation region laterally adjacent the well region and located at a second end of the well region opposite to the first end of the well region; at least one electrical contact extending from the emitter region to a top surface of the emitter region; at least one electrical contact extending from the collector region to a top surface of the collector region; at least one electrical contact extending from the base region extension to a top surface of the base region extension; and at least one electrical contact extending from the T shaped polysilicon gate to a top surface of the T shaped polysilicon gate.

Figure 4:
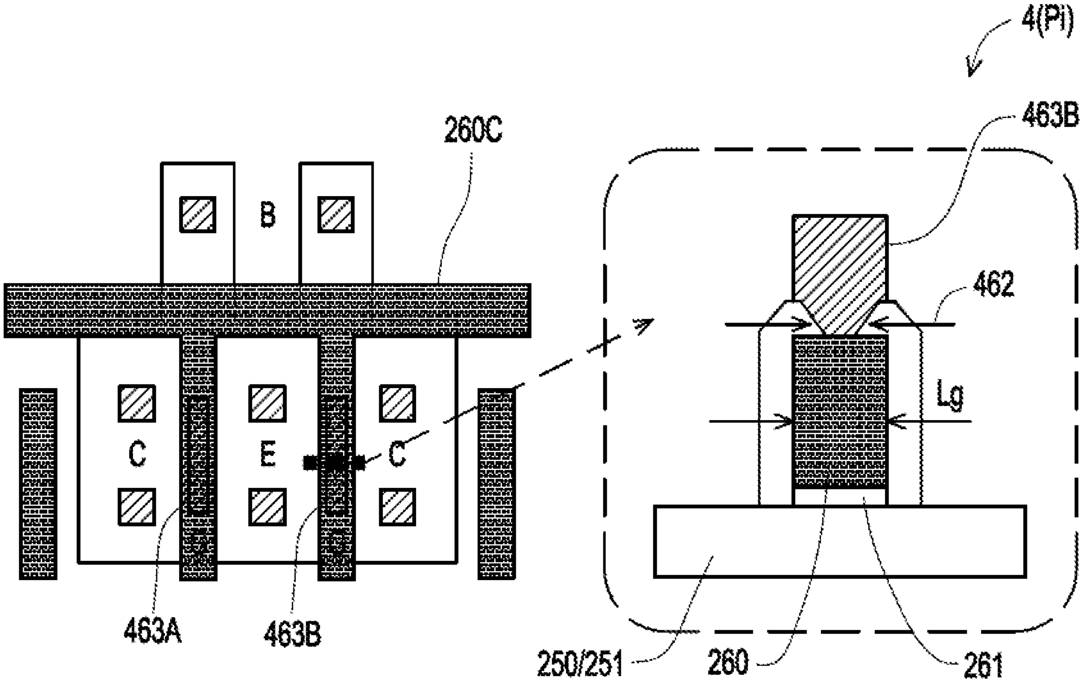
FIG. 4 illustrates a Lateral-Bipolar Junction Transistor Devices including a Pi shaped gate, and a slot gate contact arrangement.

FIG. 4 illustrates a Lateral-Bipolar Junction Transistor Device including a Pi shaped gate (as also shown in FIGS. 2A and 3B), with a slot gate contact arrangement. The gate 260 has a gate length Lg indicated in FIG. 4, which is the gate length between the emitter 130 and second collector 240 in this example. (The gate length Lg between the emitter 130 and first collector 140 may suitably also be Lg). As previously noted, the gate 260 is contacted by gate contacts, e.g. gate contacts 163A and 163B shown in FIG. 2A. With reference to FIG. 4, a side sectional view shows a slot gate contact configuration which according to some embodiments is employed to provide a still more compact layout area.

The spacer slit 462 is formed by a i) different etching rate of $SiN_x$ (remaining spacer 162, see FIG. 1) and $SiO_x$ (etched spacer), and ii) multi-stage of etching power (high ion bombarding: uniform etching of the spacer top, lower ion bombarding: gradient etching rate of spacer top and corner/sidewall). The result is a slot gate contact arrangement including a slot gate copper contact 463A/B in electrical connection with the base region 251 thru Pi shaped gate region 260 and gate oxide layer 261. The slot gate of FIG. 4 advantageously facilitates fabricating a more compact BJT device.

Figure 5A:
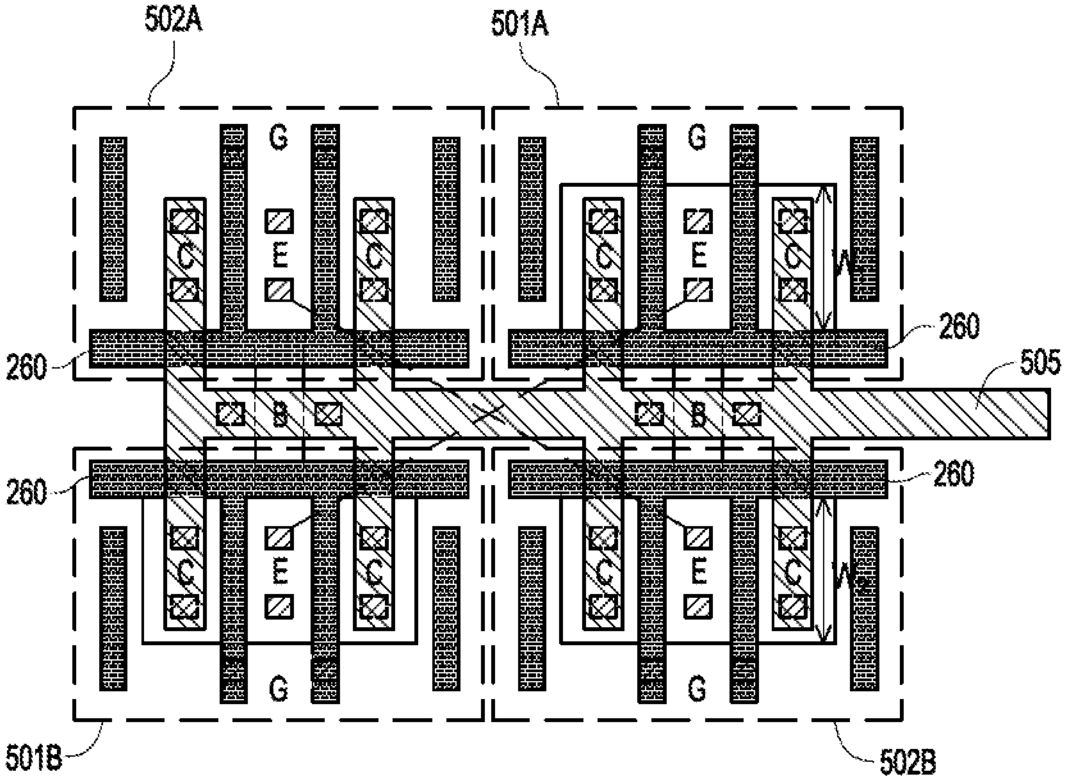
FIGS. 5A and 5B diagrammatically illustrates an example circuit (BJT thermal sensor) including a compact BJT layout with common base connections.
Figure 5B:
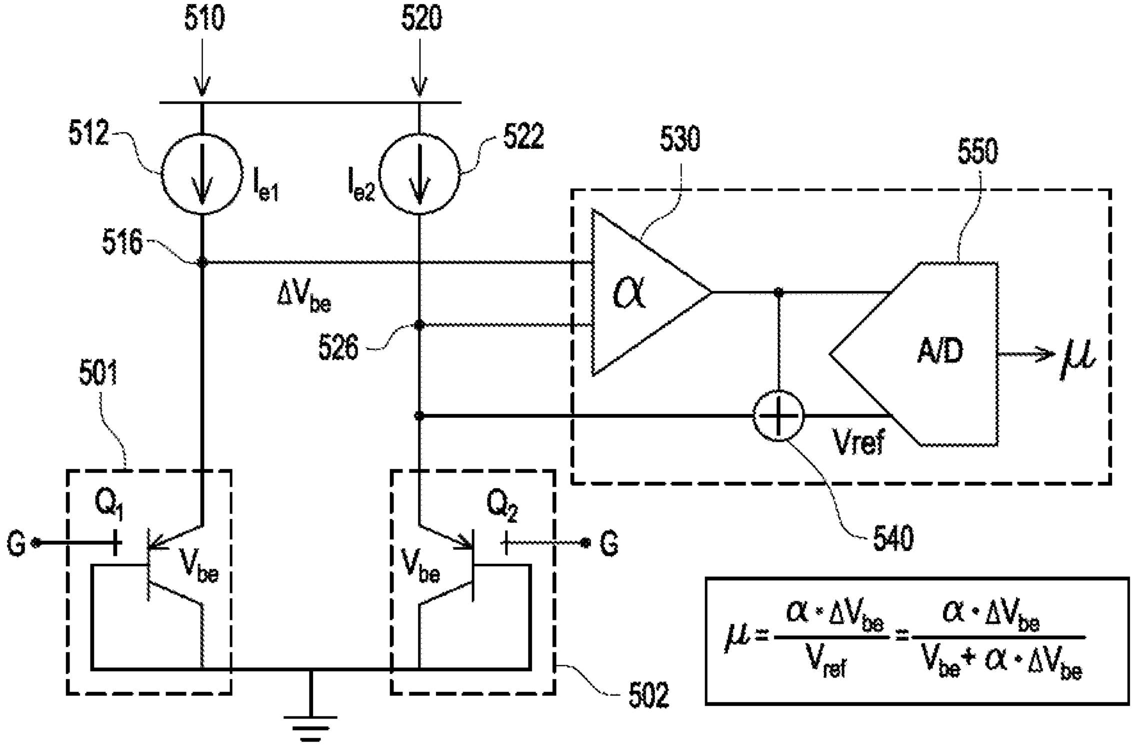

With refence to FIGS. 5A and 5B, illustrated is an example circuit (BJT thermal sensor) including a compact BJT layout with common base connections. The example circuit shown is a BJT thermal sensor circuit.

As shown in FIG. 5B, the thermal sensor circuit includes a BJT pair 501 and 502 having two branches 510, 520 respectively include corresponding current sources 512 and 522, and transistors 501 and 502 connected in series with the current sources 512 and 522. The base and collector in each of the transistors 501 and 502 are connected to each other and connected to a common reference node, e.g., a ground reference. Emitters of the transistors 501 and 502 are respectively connected to the corresponding current sources 512 and 522.

An amplifier 530 with gain a is connected to nodes 516 and 526 (e.g., emitters of the transistors 501 and 502). Particularly, two input terminals of the amplifier 530 are connected to the respective nodes 516 and 526 to receive a differential signal $\Delta V_{be}$, which is the difference between the base emitter voltage $V_{BE}$ at the emitter of the transistor 501 and the base-emitter voltage $V_{BE}$ at the emitter of the transistor 502. The base-emitter voltages $V_{BE}$ of the transistors 501 and 502 are complementary to absolute temperature (CTAT) voltages, while the difference between the two base-emitter voltages, $\Delta V_{be}$, is proportional to absolute temperature (PTAT) voltage. An adder 540 completes the circuit to provide a reference voltage Vref. The temperature can then be measured with the use of analog to digital (A/D)

converter 550 to obtain a ratio u which can be converted to a temperature value, such as degrees Celsius.

Ideal blocks in BJT-pair simulation, use the following formula:

$$\mu = \frac{\alpha \cdot \Delta V_{be}}{V_{ref}} = \frac{\alpha \cdot \Delta V_{be}}{V_{be} + \alpha \cdot \Delta V_{be}} \quad (1)$$

Regarding transistors 501 and 502, according to an embodiment of this disclosure, FIG. 5A illustrates a compact BJT layout including top row of Lateral-Bipolar Junction Transistor Devices 502A and 501A including Pi shaped gates 260 and a bottom row of Lateral-Bipolar Junction Transistor Devices 501B and 502B including Pi shaped gates 260. Emitters of Lateral-Bipolar Junction Transistor Devices 502A and 502B are electrically connected to provide transistor 502 shown in the BJT thermal circuit shown in FIG. 5B. Emitters of Lateral-Bipolar Junction Transistor Devices 501A and 501B are electrically connected to provide transistor 501 shown in the BJT thermal circuit shown in FIG. 5B. A common base metallization layer 505 electrically connects bases and collectors of transistors 501 and 502. W1 & W2 can be scaled separately, and the device illustrated provides a compact layout through common base nodes of two mirror devices. The gate terminal (G) are individual terminals controlled by a DC bias source (not shown).

Figure 6A:
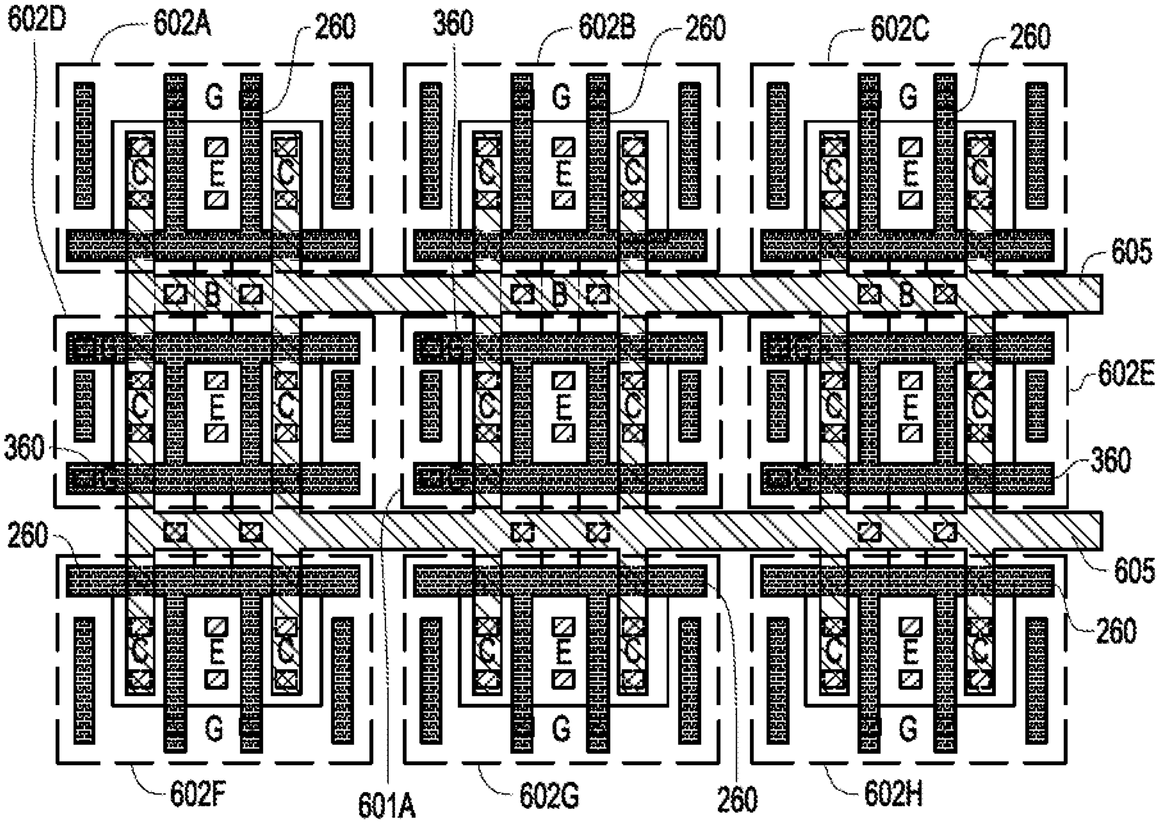
FIGS. 6A and 6B diagrammatically illustrates an example circuit (1:8 BJT band gap reference) including a compact BJT layout with Pi and H shaped gates and gate oxide layers and common base connections.
Figure 6B:
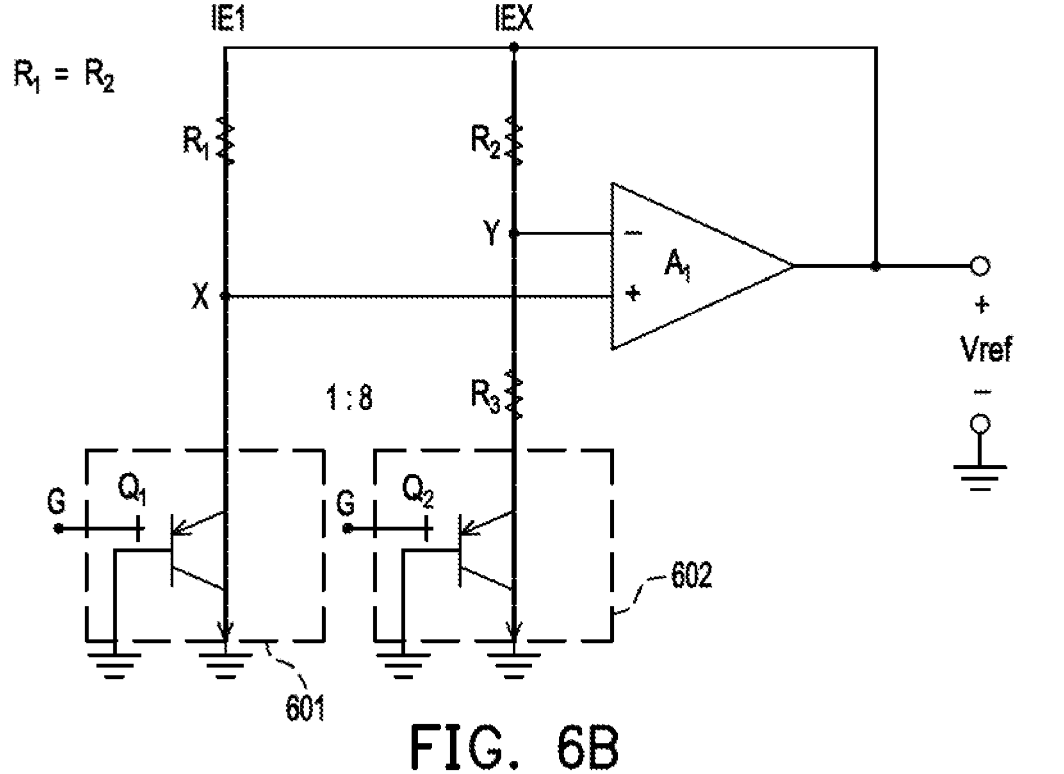

With refence to FIGS. 6A and 6B, illustrated is an example circuit (1:8 BJT bandgap voltage reference circuit) including a compact BJT layout with Pi and H shaped gates and gate oxide layers and common base connections.

A bandgap voltage reference is a temperature independent voltage reference circuit used in integrated circuits. It produces a fixed (constant) voltage independent of power supply variations, temperature changes, and circuit loading from a device.

With reference to FIG. 6B, the base-emitter voltage of a bipolar transistor typically exhibits a negative temperature coefficient. The difference between the base-emitter voltages of two bipolar transistors 601 and 602 with unequal current densities operating together exhibit a positive temperature coefficient. Therefore, a bandgap voltage generator may be designed by connecting two bipolar transistors 601 and 602 in parallel with unequal emitter current densities IE1 and IEX and ensuring that the positive and negative temperature coefficients cancel each other out. Other components of the circuit include resistors R1, R2, and R3, and Amplifier A1.

As shown in FIG. 6B, BJTs 601 and 602 are provided by a compact BJT layout arrangement using Pi gate and H gate and common base connections. The BJT layout arrangement includes a 1:8 Q1/Q2 for use in the Band Gap Reference Circuit of FIG. 6B.

As shown in FIG. 6A, the compact BJT layout arrangement includes a top outer row of Lateral-Bipolar Junction Transistor Devices 602A, 602B and 602C, each including a Pi shaped gate 260; a bottom outer row of Lateral-Bipolar Junction Transistor Devices 602F, 602G and 602H, each including Pi shaped gates 260; and a central row of Lateral-Bipolar Junction Transistor Devices 602D, 601A and 602E, each including H shaped gates 360. A common base metallization layer 605 electrically connects transistors 602A-H and 601A bases and collectors. The compact BJT layout arrangement provides a multi-cross couple layout of paired devices for a mismatch sensitive circuit. The gate terminals (G) of Q1 (601A) and Q2 (602A-H) are individually terminal controlled by a DC bias source (not shown) in the circuit.

The previous embodiments have employed lateral BJT, with gate layouts that advantageously facilitate compact BJT devices and BJT arrays, and reduce device resistances (e.g., reduced Rg and Rb). However, the disclosed gate layouts (e.g., the Pi shaped gate or H shaped gate) can also be usefully employed in other types of gated transistors, such as metal oxide semiconductor (MOS) field effect transistors (FETs).

Figure 7A:
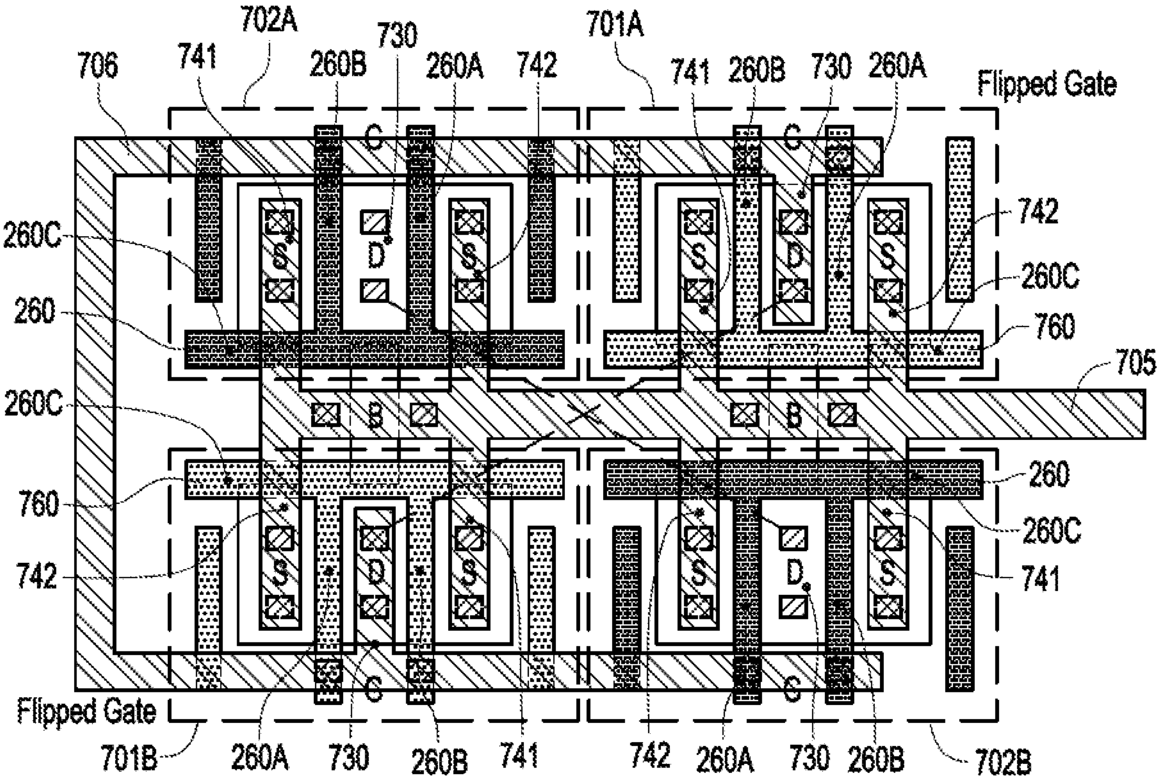
FIGS. 7A and 7B diagrammatically illustrates an example circuit (Flipped-gate band gap reference) including a compact MOS layout with Pi shaped gates and gate oxide layers and common base connections.
Figure 7B:
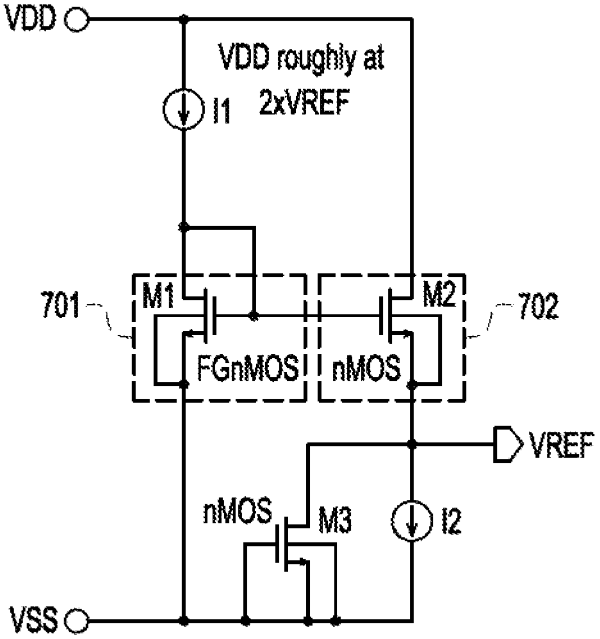

With reference to FIGS. 7A and 7B, illustrated is an example MOS circuit (Flipped-gate bandgap voltage reference circuit) including a compact MOSFET layout with Pi shaped gates and gate oxide layers and common base connections, the circuit producing bandgap reference voltage VREF. The circuit includes current source I1, FGnMOS M1 701, nMOS M2 702, current source I2 and nMOS M3.

Regarding transistors 701 and 702, according to an embodiment of this disclosure, FIG. 7A illustrates a compact MOSFET layout including a top row of MOSFET Transistor Devices 702A (nMOS) including Pi shaped gate 260, and 701A (FGnMOS Flipped Gate) including Pi shaped gate 760, and a bottom row of MOS Transistor Devices 701B (FGnMOS Flipped Gate) including Pi shaped gate 760 and 702B (nMOS) including Pi shaped gate 260. Each MOS transistor includes: a drain region 730; a first source region 741 and a second source region 742; and a Pi shaped gate and gate oxide layer, the Pi shaped gate including a first gate portion 260A extending between the drain region 730 and the first source region 741, a second gate portion 260B parallel to the first gate portion 260A and extending between the drain region 730 and the second source region 742, and a first connecting gate portion 260C transverse to the first and second gate portions and connecting the first and second gate portions. A flipped-gate process of swapping N/PMOS polysilicon-gate pre-dopant or metal gate stack can change the surface potential of the body Si and affect the n-factor as applying negative Vg bias. MOSFET Transistor Devices 701A, 701B, 702A and 702B source and bases are electrically connected using metallization layer 705 to provide transistors 702 and 701 shown in the Flipped-gate bandgap voltage reference circuit shown in FIG. 5B.

The circuit of FIG. 7B provides a bandgap reference VREF as follows. The two MOS transistors 701 and 702 are connected in a common gate, configuration, i.e. they have a common gate voltage $V_G$. Considering the MOS M1, it is seen that the common gate voltage $V_G$ can be written as $V_G=V_{SS}+V_{GS,1}$, where $V_{GS,1}$ is the gate-to-source voltage of the MOS M1. Considering the MOS M2, it is seen that this common gate voltage $V_G$ can be written as $V_G=VREF+V_{GS,2}$, where $V_{GS,2}$ is the gate-to-source voltage of the MOS M2. Equating the right-hand expressions for the common gate voltage $V_G$ given by these two equations yields $V_{SS}+V_{GS,1}=VREF+V_{GS,2}$, which can be rearranged to yield the reference voltage as:

$$VREF = V_{SS} + (V_{GS,1} - V_{GS,2}) = V_{SS} + \Delta V_{GS} \quad (2)$$

where $\Delta V_{GS}=V_{GS,1}-V_{GS,2}$. If $V_{SS}$ is taken as circuit ground so that $V_{SS}=0$, then the output reference voltage $VREF=\Delta V_{GS}$. The different transistor types (FGnMOS 701 versus nMOS 702) results in a different threshold voltages for the two transistors 701 and 702, so that $\Delta V_{GS}$ is nonzero.

In the following, some further embodiments are described.

In a nonlimiting illustrative embodiment, a lateral-bipolar junction transistor (BJT) is disclosed. The lateral-bipolar junction transistor (BJT includes a semiconductor substrate; an insulator region disposed on the semiconductor substrate; a well region comprising a well semiconductor of a first conductivity type disposed over the insulator region; an emitter region of a second conductivity type disposed in the well region; a first collector region of the second conductivity type and a second collector region of the second conductivity type disposed in the well region; a Pi shaped or H shaped gate and gate oxide layer, the Pi or H shaped gate including a first gate portion extending between the emitter region and the first collector region, a second gate portion parallel to the first gate portion and extending between the emitter region and the second collector region, and a first connecting gate portion transverse to the first and second gate portions and connecting the first and second gate portions; and a first base region disposed underneath the first gate portion and a second base region disposed underneath the second gate portion.

In a nonlimiting illustrative embodiment, a circuit is disclosed. The circuit includes a plurality of MOS transistors. Each MOS transistor includes: a semiconductor substrate; an insulator region disposed on the semiconductor substrate; a well region comprising a well semiconductor of a first conductivity type disposed over the insulator region; a drain region of a second conductivity type disposed in the well region; a first source region of a second conductivity type and a second source region of the second conductivity type disposed in the well region; a Pi shaped gate and gate oxide layer, the Pi shaped gate including a first gate portion extending between the drain region and the first source region, a second gate portion parallel to the first gate portion and extending between the drain region and the second source region, and a first connecting gate portion transverse to the first and second gate portions and connecting the first and second gate portions; and a first base region disposed underneath the first gate portion and a second base region disposed underneath the second gate portion.

In a nonlimiting illustrative embodiment, a method of forming a lateral-bipolar junction transistor is disclosed. The method of forming a lateral-bipolar junction transistor including: providing a semiconductor substrate; forming an insulator region on the semiconductor substrate; forming a well region comprising a well semiconductor of first conductivity type over the insulator region; forming an emitter region of the second conductivity type disposed in the well region; forming a first collector region of a second conductivity type and a second collector region of the second conductivity type in the well region; forming a Pi shaped or H shaped gate and a gate oxide layer, the Pi or H shaped gate including a first gate portion extending between the emitter region and the first collector region, a second gate portion parallel to the first gate portion and extending between the emitter region and the second collector region, and a first connecting gate portion transverse to the first and second gate portions and connecting the first and second gate portions; and forming a first base region disposed underneath he first gate portion and a second base region disposed underneath the second gate portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lateral-bipolar junction transistor comprising:
- a semiconductor substrate;
- an insulator region disposed on the semiconductor substrate;
- a well region comprising a well semiconductor of a first conductivity type disposed over the insulator region;
- an emitter region of a second conductivity type disposed in the well region;
- a first collector region of the second conductivity type and a second collector region of the second conductivity type disposed in the well region;
- a Pi shaped or H shaped gate and gate oxide layer, the Pi or H shaped gate including a first gate portion extending between the emitter region and the first collector region, a second gate portion parallel to the first gate portion and extending between the emitter region and the second collector region, and a first connecting gate portion transverse to the first and second gate portions and connecting the first and second gate portions; and
- a first base region disposed underneath the first gate portion and a second base region disposed underneath the second gate portion.

2. The lateral-bipolar junction transistor of claim 1,
- wherein the Pi shaped or H shaped gate is an H shaped gate that further includes a second connecting gate portion arranged parallel with the first connecting gate portion and also connecting the first and second gate portions, and
- wherein the emitter region and the first and second collector regions are disposed between the first connecting gate portion and the second connecting gate portion.

3. The lateral-bipolar junction transistor of claim 1, further comprising:
- at least one slot gate contact extending from the Pi shaped or H shaped gate to a top surface of the Pi shaped or H shaped gate.

4. The lateral-bipolar junction transistor of claim 1, further comprising:
- a metallization layer including a conductive trace electrically connecting the first and second collector regions to provide a single collector.

5. The lateral-bipolar junction transistor of claim 4, wherein the conductive trace also electrically connects the first and second base regions to the single collector.

6. The lateral-bipolar junction transistor of claim 1, wherein
- the semiconductor substrate is a silicon (Si) substrate;
- the insulator region is silicon dioxide;
- the well region is a P type well;
- the emitter region is N+ doped; and
- the first and second collector regions are N+ doped.

7. The lateral-bipolar junction transistor of claim 1, wherein:
- the first base region comprises a first undepleted or partially depleted portion of the well semiconductor located underneath the first gate portion and surrounded by a depleted portion of the well semiconductor, and the second base region comprises a second undepleted or partially depleted portion of the well semiconductor located underneath the second gate portion and surrounded by the depleted portion of the well semiconductor.

8. The lateral-bipolar junction transistor of claim 1, further comprising:

a first base region extension region laterally extending the first base region and a second base region extension region laterally extending the respective first and second base regions, the first and second base region extension regions associated with a first end of the well region, to provide first and second base region connections beyond the Pi shaped or H shaped gate covering of a top surface of the first and second base regions.

9. The lateral-bipolar junction transistor of claim 1, wherein the Pi shaped or H shaped gate is H shaped, and the lateral-bipolar junction transistor further comprises:

a third and a fourth base region extension region laterally extending the respective first and second base regions, associated with a first end of the well region, to provide third and fourth base region connections beyond the H shaped gate covering of a top surface of the first and second base regions.

10. A circuit including a plurality of lateral bipolar junction transistors as set forth in claim 1, further comprising:

a metallization layer connecting the first and second collector regions and the first and second base regions of the plurality of lateral-bipolar junction transistors together.

11. A circuit including a plurality of lateral bipolar junction transistors as set forth in claim 1, including a row of central lateral bipolar junction transistors disposed between first and second outer rows of lateral bipolar junction transistors, wherein the central lateral bipolar junction transistors have H shaped gates and the outer bipolar junction transistors have Pi shaped gates, the circuit further comprising:

a metallization layer including:

a first trace connecting the first and second collector regions and the first and second base regions of the central lateral bipolar junction transistors and the first outer row of lateral bipolar junction transistors; and a second trace connecting the first and second collector regions and the first and second base regions of the central lateral bipolar junction transistors and the second outer row of lateral bipolar junction transistors.

12. A circuit comprising:

a plurality of MOS transistors, each MOS transistor including:

a drain region;

a first source region and a second source region; and a Pi or H shaped gate and gate oxide layer, the Pi or H shaped gate including a first gate portion extending between the drain region and the first source region, a second gate portion parallel to the first gate portion and extending between the drain region and the second source region, and a first connecting gate portion transverse to the first and second gate portions and connecting the first and second gate portions;

wherein the plurality of MOS transistors include an nMOS transistor and a flipped-gate nMOS transistor.

13. The circuit of claim 12, wherein the circuit comprises a voltage reference circuit in which the Pi or H shaped gates of the nMOS transistor and the flipped-gate nMOS transistor are connected as a common gate, and the flipped-gate nMOS transistor has a different threshold voltage than the nMOS transistor.

14. A method of forming a lateral-bipolar junction transistor, the method comprising:

providing a semiconductor substrate;

forming an insulator region on the semiconductor substrate;

forming a well region comprising a well semiconductor material of first conductivity type over the insulator region;

forming an emitter region of a second conductivity type disposed in the well region;

forming a first collector region of the second conductivity type and a second collector region of the second conductivity type in the well region;

forming a Pi shaped or H shaped gate and a gate oxide layer, the Pi or H shaped gate including a first gate portion extending between the emitter region and the first collector region, a second gate portion parallel to the first gate portion and extending between the emitter region and the second collector region, and a first connecting gate portion transverse to the first and second gate portions and connecting the first and second gate portions; and forming a first base region disposed underneath the first gate portion and a second base region disposed underneath the second gate portion.

15. The method of forming a lateral-bipolar junction transistor according to claim 14, wherein the Pi shaped or H shaped gate is an H shaped gate and the method further comprises:

forming a second connecting gate portion arranged parallel with the first connecting gate portion and also connecting the first and second gate portions, wherein the emitter region and the first and second collector regions are disposed between the first connecting gate portion and the second connecting gate portion.

16. The method of forming a lateral-bipolar junction transistor according to claim 14, further comprising:

forming at least one electrical contact extending from the emitter region to a top surface of the emitter region;

forming at least one electrical contact extending from the first collector region to a top surface of the first collector region;

forming at least one contact extending from a top surface of the second collector region;

forming at least one electrical contact extending from the first base region extension to a top surface of the first base region extension;

forming at least one electrical contact extending from the second base region extension to a top surface of the second base region extension; and forming at least one electrical contact extending from the polysilicon gate to a top surface of the polysilicon.

17. The method of forming a lateral-bipolar junction transistor according to claim 14, further comprising:

electrically connecting the first and second collector regions to provide a single collector.

18. The method of forming a lateral-bipolar junction transistor according to claim 14, wherein, the semiconductor substrate is a silicon (Si) substrate;

the insulator region is silicon dioxide;

the well region is a P type well;

the emitter region is N+ doped; and the first and second collector regions are N+ doped.

19. The method of forming a lateral-bipolar junction transistor according to claim 14, further comprising:

forming a depleted region and a partially depleted region in each of the first and second base regions.

20. The method of forming a lateral-bipolar junction transistor according to claim 14, wherein the gate is H shaped, and the method further comprises:

forming a third and a fourth base region extension region laterally extending the respective first and second base regions, associated with a first end of the well region, to provide a third and fourth base region connections beyond the H shaped gate covering of the top surface of the first and second base regions.

* * * * *